United States Patent [19]

Pai

[11] Patent Number: 5,280,413
[45] Date of Patent: Jan. 18, 1994

[54] HERMETICALLY SEALED CIRCUIT MODULES HAVING CONDUCTIVE CAP ANCHORS

[75] Inventor: Deepak K. Pai, Burnsville, Minn.

[73] Assignee: Ceridian Corporation, Bloomington, Minn.

[21] Appl. No.: 946,950

[22] Filed: Sep. 17, 1992

[51] Int. Cl.⁵ .................................................. H05K 1/14
[52] U.S. Cl. .................................. 361/792; 361/707; 361/760; 361/807; 361/813; 174/17.05; 174/50.51; 174/52.1; 257/686; 257/700
[58] Field of Search ............... 361/380, 396, 397, 388, 361/400, 401, 403, 412, 414, 417, 418, 421; 174/17.05, 50.5, 50.51, 52.1; 29/840; 257/700, 686

[56] References Cited

U.S. PATENT DOCUMENTS

| | | | |
|---|---|---|---|
| 3,693,239 | 9/1972 | Dix | 29/470 |
| 3,760,090 | 9/1973 | Fowler | 174/52 |
| 3,872,583 | 3/1975 | Beall et al. | 29/624 |
| 4,012,832 | 3/1977 | Crane | 29/575 |
| 4,023,562 | 5/1977 | Hynecek et al. | 128/2.05 E |
| 4,067,955 | 2/1978 | Gates, Jr. | 174/52 FP |
| 4,264,917 | 4/1981 | Ugon | 357/74 |
| 4,331,258 | 5/1982 | Geschwind | 220/52 FP |
| 4,539,622 | 9/1985 | Akasaki | 361/401 |
| 4,560,826 | 12/1985 | Burns et al. | 174/52 FP |
| 4,631,820 | 12/1986 | Harada et al. | 29/840 |
| 4,633,573 | 1/1987 | Scherer | 29/589 |
| 4,640,436 | 2/1987 | Miyoshi et al. | 220/359 |
| 4,672,151 | 6/1987 | Yamamura | 174/52 FP |
| 4,925,024 | 5/1990 | Ellenberger et al. | 206/328 |
| 4,959,900 | 10/1990 | do Givry et al. | 29/388 |
| 5,027,191 | 6/1991 | Bourdelaise et al. | 357/74 |
| 5,043,533 | 8/1991 | Spielberger | 174/52.4 |
| 5,049,978 | 9/1991 | Bates et al. | 357/74 |
| 5,070,041 | 12/1991 | Katayama et al. | 437/214 |
| 5,071,712 | 12/1991 | Frampton | 428/573 |
| 5,091,770 | 2/1992 | Yamaguchi | 357/74 |

FOREIGN PATENT DOCUMENTS 61-7656  1/1986  Japan ................................ 257/700

*Primary Examiner*—Lincoln Donovan
*Assistant Examiner*—Young Whang

[57] ABSTRACT

A circuit module includes a multilayer circuit board having a plurality of alternate layers defining circuit paths and insulation with conductive vias between selected circuit paths of different layers. A hermetic seal is sealed to the top layer of the multilayer circuit board, and the circuit paths and/or vias are selectively connected to external pads by vias extending through the multilayer circuit board, one via terminating at a pad internal to the sealed region and another via terminating at the external pad. In one form, the vias providing the external connection extend into a substrate supporting the board, and circuit paths in the substrate electrically connect the vias together. In a second form, the vias providing the external connection are electrically connected together by selected circuit paths in the circuit board. A conductive anchor extends through the circuit board to the substrate to provide an anchor for the seal. Where the vias providing external connection are connected by selected circuit paths in the circuit board, the conductive anchor comprises posts having openings through which the selected circuit paths pass.

17 Claims, 4 Drawing Sheets

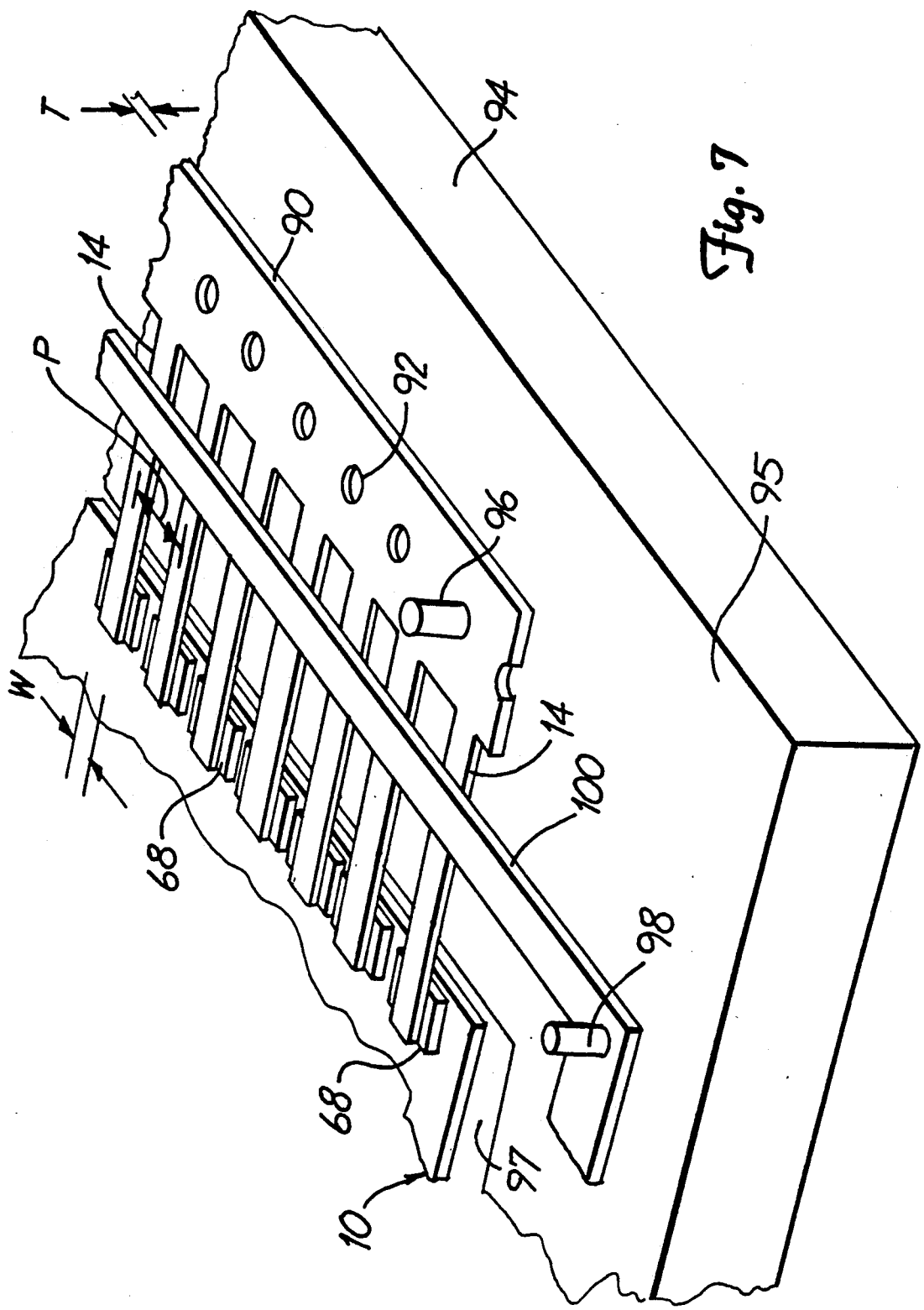

HERMETICALLY SEALED CIRCUIT MODULES HAVING CONDUCTIVE CAP ANCHORS

BACKGROUND OF THE INVENTION

This invention relates to hermetically sealed electronic circuit modules.

Circuit modules have been hermetically sealed to protect the sensitive circuit components from harsh environmental conditions. Heretofore, it has been difficult to provide conductive paths between circuit components within the package to termination pads external of the package. Typically, chips or other circuit components are mounted in the package to one side of a wiring board or substrate and are electrically connected to termination pads within the hermetically sealed region. Conductive vias extend vertically through the board or substrate to connect the internal pads to pads outside the hermetically sealed region. The conductive vias are constructed by well-known plated-through or plated-up hole techniques by which holes in the board or substrate are plated or filled with conductive material to form the conductive vias. Alternatively, the vias may be formed by a deposition process. An example of the use of conductive vias to accomplish external connection in hermetically sealed modules may be found in U.S. Pat. No. 4,560,826 granted Dec. 24, 1985 to Burns et al.

The fabrication of the conductive vias require processing steps during the construction of the wiring board and/or substrate which are not normally incurred in processing the board. More particularly, conductive vias were employed in prior hermetically sealed modules only to extend through the board or substrate for external connection. Consequently, formation of these vias represented additional processing steps which added significantly to the cost of the module.

Another difficulty with hermetically sealed electronic packages and modules resides in the adequacy of the seal itself. Prior packages employed a metal ring and lid bonded by glass solder to a ceramic substrate. The glass insulated the ring from the wiring board to permit leads to pass thereunder from the region inside the sealed module to the external portions. One difficulty with such a metal-glass-ceramic construction is that environmental conditions, such as pressure and temperature variations, cause fatigue in the glass solder and failure of the seal. An example of the use of glass bonding of hermetic seals to packages may be found in U.S. Pat. No. 4,925,024 granted May 15, 1990 to Ellenberger et al.

To overcome the problems associated with metal seals, sealing rings constructed of a material more closely matching the thermal expansion characteristics of the ceramic substrate have been employed. For example, an iron-nickel-cobalt alloy marketed under the trademark KOVAR provides good thermal matching characteristics to the ceramic substrate. Also, KOVAR is provides good magnetic shielding. However, the iron-nickel-cobalt alloy is difficult to attach to ceramic substrates. Consequently, metalized ceramic sealing rings were used having KOVAR rings or flanges brazed thereto. An example of the use of KOVAR flanges brazed to ceramic sealing rings is found in U.S. Pat. No. 4,076,955 granted Feb. 28, 1978 to Gates, Jr.

BRIEF DESCRIPTION OF THE INVENTION

In one form of the invention, a circuit module includes a multilayer circuit board having a plurality of alternate layers defining circuit paths which are separated by insulation layers. Conductive vias extend between selected circuit paths of different layers. A hermetic seal is sealed to the top layer of the multilayer circuit board to enclose circuit components in a hermetically sealed region. Selected circuit paths and/or vias are connected to external pads outside the sealed region by vias extending through selected layers of the multilayer circuit board, one via terminating internally to the sealed region and another via terminating at the external pad.

In a first option, the vias providing the external connection extend into a substrate supporting the board, and circuit paths in the substrate electrically connect the vias together.

In a second option, the vias providing the external connection are electrically connected together by selected circuit paths in the circuit board.

According to another form of the invention, a conductive anchor extends through the circuit board to the substrate and provides an anchor for the seal. Advantageously, the conductive anchor forms a conductive wall surrounding the circuit paths within the hermetically-sealed region to enhance shielding from stray electrical and magnetic fields. In the option where the vias providing external connection are connected by selected circuit paths in the circuit board, the conductive anchor comprises posts having openings through which the selected circuit paths pass.

BRIEF DESCRIPTION OF THE DRAWINGS

FIG. 7 is an enlarged perspective view, as in FIG. 6, of a portion of the apparatus illustrated in FIG. 6.

DETAILED DESCRIPTION OF THE PREFERRED EMBODIMENTS

Figure 1:
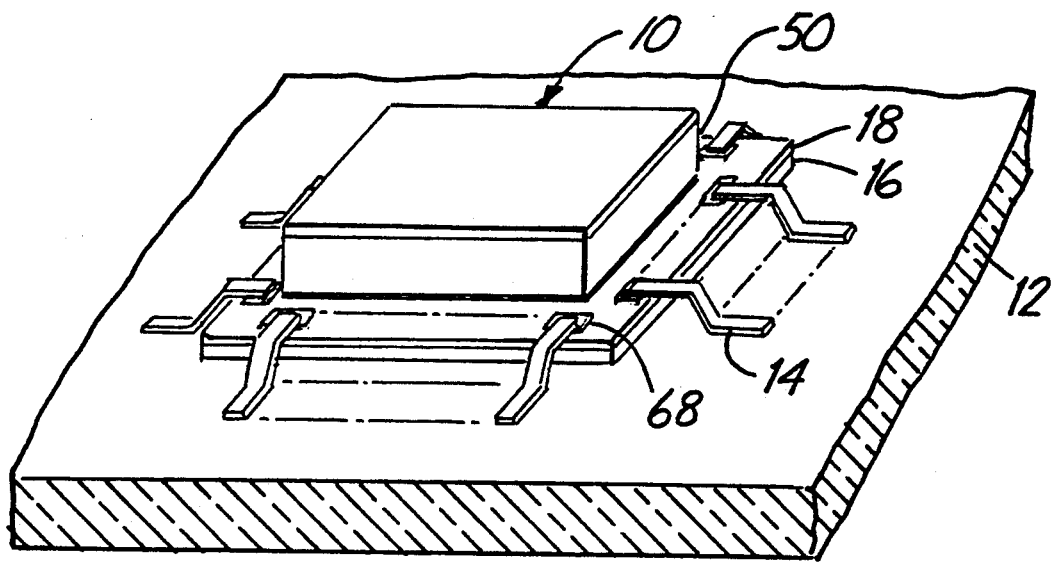
FIG. 1 is a perspective view of a hermetically sealed electronic circuit module in accordance with the presently preferred embodiment of the present invention, the module being shown connected to a mother board.
Figure 2:
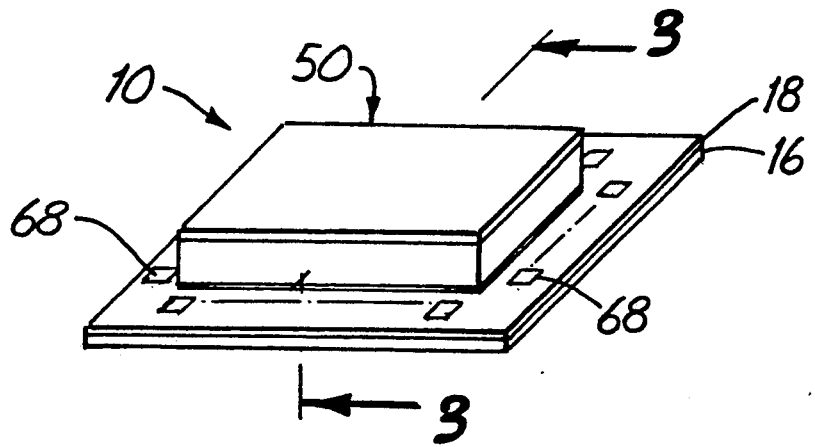
FIG. 2 is a perspective view, as in FIG. 1, of the hermetically sealed module.
Figure 3:
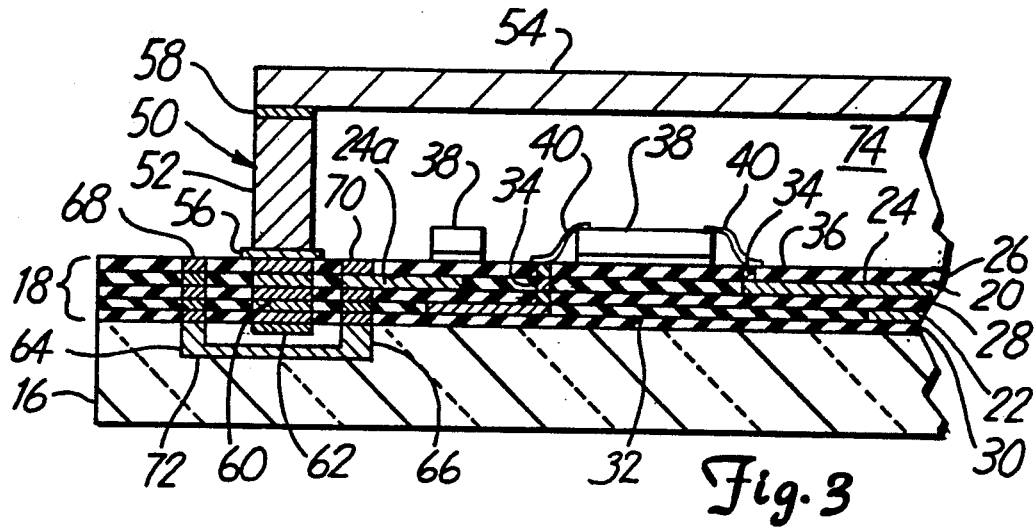
FIG. 3 is a section view taken at line 3—3 in FIG. 2 showing a preferred embodiment of the present invention.

FIG. 1 is a perspective view of a circuit module 10 in accordance with the present invention connected to mother board 12 by leads 14. As shown in FIGS. 2 and 3, circuit module 10 includes substrate 16 on which is mounted multilayer wiring board 18. Substrate 16 is preferably constructed of ceramic, such as AlN, $Al_2O_3$, BeO, or SiC. Multilayer board 18 is a sandwich comprising a plurality of first layers 20, 22 having selected conductive circuit paths 24 defined therein, paths 24 being constructed of a suitable conductive material such as copper. A plurality of second layers 26, 28 and 30, constructed of suitable insulator material such as polyimide or aluminum oxide ($Al_2O_3$), separates layers 20 and 22 and the conductive paths 24 therein. Layers 20 and 22 also include polyimide or aluminum oxide insulator material 32 in the areas of layers 20 and 22 where circuit paths 24 are not present, material 32 acting as a spacer between adjacent insulator layers. Conductive vias 34 are constructed of copper and extend between top surface 36 of board 18 and selected ones of the circuit paths 24 in selected layers 20, 22. Conductive vias 34 may be constructed by deposition techniques during the formation of the successive layer of board 18, or may be constructed by techniques employing plated-through or plated-up holes, well known in the art. Electrical components 38, such as semiconductor chips, are mounted to top surface 36 of board 18 and are electrically connected by leads 40 to conductive pads formed by vias 34.

A hermetic seal 50 comprises a skirt 52 and lid 54, both preferably constructed of a iron-nickel-cobalt alloy such as KOVAR. Seal 50 is fastened by adhering skirt 52 to surface 36 of multilayer board 18 with a conductive adhesive or a conductive solder 56. Lid 54 is attached to skirt 52 by conductive adhesive 58.

Conductive anchor 60 is formed by successive copper layers in each layer of printed multilayer board 18. In the embodiment shown in FIG. 3, anchor 60 includes at least a portion 62 formed in substrate 16 at the interface with multilayer board 18. Conductive vias 64 and 66 constructed of copper extend between conductive path 72 in substrate 16 and a selected conductive pad 68 or 70 on surface 36 of board 18. Vias 64 and 66 may be formed by deposition of copper during the formation of each layer of board 18, or may be formed employing plated-through or plated-up hole techniques. Advantageously, vias 64 and 66 are formed during the manufacturing process of board 18, using the same process steps as is employed to form vias 34. Via 64 terminates at pad 68 on surface 36 of the board, whereas via 66 terminates at either pad 70 on surface 36 or at a selected circuit path 24a within the board, or both as shown in FIG. 3. Pad 70 or circuit path 24a is connected to one or more circuit components 38 inside the hermetically sealed region 74 of the module.

Skirt 52 and lid 54 together provide a cap 50 to hermetically seal region 74 from the environment outside the cap. Thus, components 38 mounted to the circuit board within region 74 are hermetically seal from the environment.

Electrical connection of components 38 to pads outside region 74 is accomplished through vias and circuit paths formed during the formation of board 18. Thus, vias 34, 64 and 66 are constructed with well known deposition techniques, plated-through hole techniques, or plated-up hole techniques during the fabrication of board 18. Likewise, the successive layers forming anchor 60 are formed by well known deposition techniques during the formation of the successive layers of multilayer board 18. That portion 62 of anchor 60 and those portions of vias 64 and 66 and conductive path 72 formed in the substrate are preformed in the substrate before attaching circuit board 18 to the substrate.

In one form of the invention, conductive anchor 60 forms a wall surrounding hermetically sealed region 74. Anchor 60, extending through board 18 to substrate 16, cooperates with seal 50 to provide a shield against stray electric and magnetic fields for the components 38 within region 74. Thus, stray magnetic and electrostatic interference outside the hermetic package is shielded out of the region 74. Moreover, the anchor 60 forms a sturdy base for seal 50 which is resistant to stress caused by variation in temperature and pressure on the package which might otherwise cause fatigue on solder joint or conductive adhesive 56. Thus, with anchor structurally embedded in board 18, structural integrity is provided for the seal and anchor, without resorting to additional support flanges and the like required by the prior art.

Figure 4:
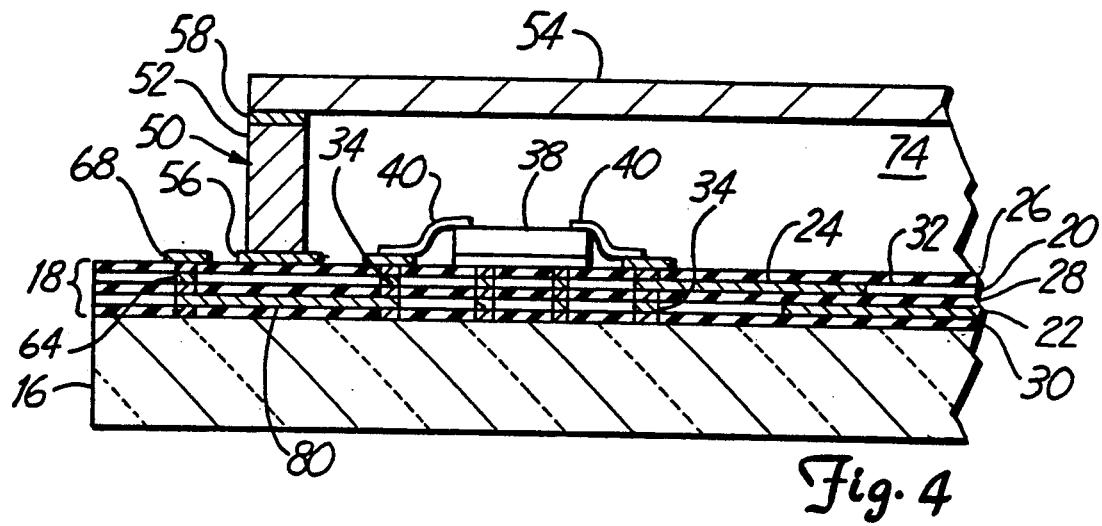
FIG. 4 is a section view, as in FIG. 3, showing a modification of the present invention.
Figure 5:
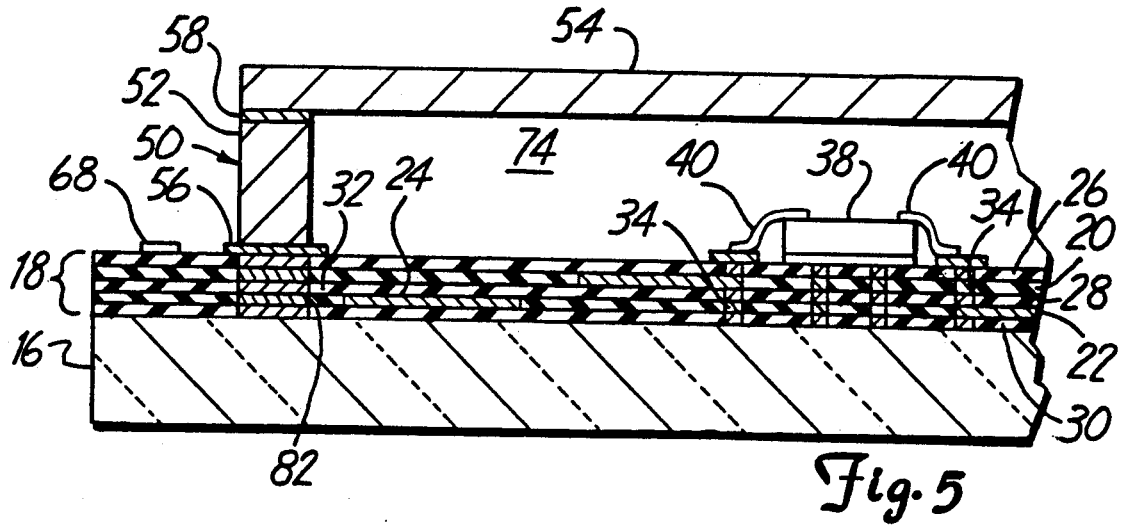
FIG. 5 is a section view of the apparatus illustrated in FIG. 4 taken along a plane parallel to section plane of FIG. 4.

FIGS. 4 and 5 illustrate a modification of the present invention in which selected circuit paths 80 within a selected layer 22 of the multilayer board 18 connect vias 64 to vias 34. FIGS. 4 and 5 are section views taken in parallel planes with FIG. 4 being a section view through the pads and connection means between region 74 and the external portion of the module, and FIG. 5 being a section view between adjacent pads and connection means. In the embodiment shown in FIGS. 4 and 5, vias 34 terminate at a pad to which a component 38 is attached. Alternatively, a via 34 may be connected to a different circuit path 24. As shown particularly in FIG. 5, cap 50 is anchored to substrate 16 by conductive anchor posts 82 formed in the layers in the circuit board 18. The arrangement shown in FIGS. 4 and 5 provides the advantage of employing a conductive path in a layer of board 18 between posts 82 to provide external connection without the need to extend into the substrate, as in FIG. 3. The arrangement of FIGS. 4 and 5 provides somewhat reduced field shielding and somewhat reduced structural support for the seal than the arrangement of FIG. 3, although shielding and anchor support are adequate for most purposes.

Figure 6:
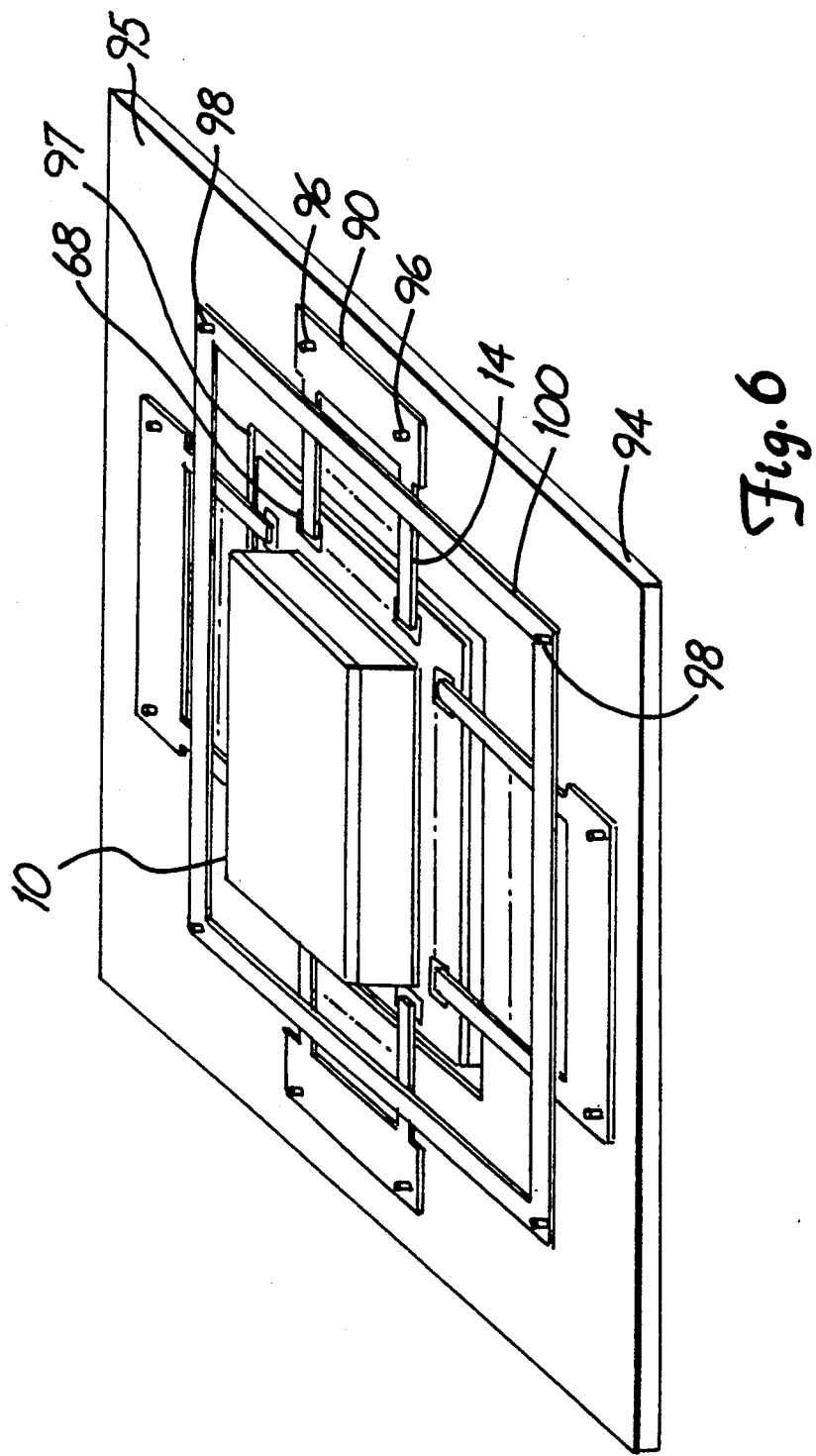
FIG. 6 is a perspective view, as in FIG. 1, illustrating the method of attaching conductive leads to the electric module of FIG. 2.

FIGS. 6 and 7 illustrate a technique for attaching conductive leads 14 to the hermetic package and particularly to pads 68 thereof. Leads 14 initially are connected to or integral with a common support strip 90. Leads 14 have a prescribed width W and thickness T and are positioned at a prescribed pitch P (as measured between the centers of successive leads). As examples, leads 14 may have a width W between 0.002 and 0.012 inches, a thickness T between 0.0014 and 0.006 inches, and a pitch P between 0.004 and 0.025, depending upon their intended application. The leads are intergal with common support strips 90 which include a row of sized apertures 92 to aid in severing the support strip to a desired length to match a side of the module. Conveniently, leads 14 are fabricated with at least twice the desired length, with support strips 90 at both ends for structural support during manufacture and transportation. The lead structure may be supplied in rolls so that a selected portion may be removed for use in manufacturing a module.

In use, the leads are severed at the midpoint between the support strips, resulting in lead structures as shown in FIGS. 6 and 7 supported by a single support strip 90. The support strip is severed through selected apertures 92 to a desired length to match the external pad configuration of the module. Module 10 is positioned in a sized opening 97 in tool 94, and the lead assembly comprising leads 14 and support strip 90 are positioned on flat surface 95. Tool 94 includes a plurality of first locator pins 96 arranged to be received in selected apertures 92 of support strip 90. As shown particularly in FIG. 7, with module 10 positioned in opening 97 and common support strip 90 positioned on tool 92 with pins 96, leads 14 directly align with individual pads 68 on module 10.

Tool 94 includes a second plurality of locator pins 98 arranged to be received in apertures in nonconductive tie bar 100. Tie bar 100 serves to clamp leads 14 in position against surface 95 while the leads are tinned and soldered to pads 68. Conveniently, fastener means, not shown, may be employed to hold the clamped assembly together during tinning and/or soldering.

While common support strip 90 may be severed and removed from leads 14 before or after tinning and soldering the leads to pads 68, it is preferred that the common support strip be removed before tinning and soldering. More particularly, with common support strip 90 removed and clamping provided by the non-conductive tie bar, there are no reactive forces transmitted by the support strip between the several leads 14 which might interfere with the positioning of leads 14 to pads 68. Hence, the individual leads conform to the height or position of the pads without interference from the common support strip or the other leads.

The present invention provides an effective and economic technique for manufacturing hermetically sealed electronic modules having conductive paths from the interior of the module to conductive pads at the exterior. The invention also provides a superior seal and connection of the seal, for both hermetically sealing the environment of the package from the external environment and to provide good shielding from electric and magnetic field interferences. While the advantages of the present invention have been described in connection with conductive paths using a multilayer board and the use of a conductive anchor, each of these features is might be employed to great advantage without employing the other feature. For example, a conductive anchor for a seal might be employed with conductive paths extending through the seal, rather than under it as shown in the drawings, or the conductive paths might employ techniques other than multilayer circuit techniques. Likewise, conductive paths for external connection might be accomplished using multilayer circuit techniques without employing the conductive anchor.

Although the present invention has been described with reference to preferred embodiments, workers skilled in the art will recognize that changes may be made in form and detail without departing from the spirit and scope of the invention.

What is claimed is:

1. An electronic module comprising, in combination:
   (a) a multi-layer circuit board comprising a plurality of layers defining circuit paths in a plurality of first layers and insulation in a plurality of second layers between the first layers, and conductive vias extending through selected layers between selected ones of the circuit paths in different ones of the first layers, at least some of the circuit paths being exposed to a top surface of the circuit board;
   (b) a plurality of circuit components supported on the top surface of the circuit board and electrically connected to selected ones of the exposed circuit paths;
   (c) a substrate, the multi-layer circuit board being supported on the substrate;
   (d) a cap anchor formed of a conductive portion in each of the plurality of layers of the circuit board, the conductive portions being stacked between the top surface and the substrate;
   (e) a cap having a lid and a skirt portion hermetically sealed to the top surface of the circuit board to enclose a region of the circuit board in which the circuit components are supported, the skirt of the cap being sealed to the cap anchor;
   (f) a plurality of conductive pads on the top surface of the circuit board outside the region enclosed by the cap; and
   (g) conductive paths connecting individual conductive pads to selected ones of the circuit paths and vias.

2. The module of claim 1 wherein a conductive adhesive connects the skirt portion to the cap anchor at the top surface of the circuit board.

3. The module of claim 1 wherein the skirt portion is soldered to the cap anchor at the top surface of the circuit board.

4. The module of claim 1 wherein the cap anchor substantially surrounds the region of the circuit board supporting the circuit components.

5. The module of claim 1 wherein the cap anchor further includes a conductive anchor portion in the substrate.

6. The module of claim 1 wherein the stack of conductive portions forming the cap anchor forms a conductive wall surrounding the region of the circuit board supporting the circuit components and the conductive paths each comprise a conductive portion in the substrate below and separated from the conductive wall, a second conductive via extending through the plurality of layers forming the circuit board between the conductive portion and the top surface of the circuit board outside the region enclosed by the cap, and a third conductive via extending through at least a portion of the circuit board between the conductive portion and a selected circuit path or the top surface of the circuit board within the region of the circuit board supporting the circuit components.

7. The module of claim 6 wherein the cap anchor further includes a conductive anchor portion in the substrate.

8. The module of claim 6 wherein a conductive adhesive connects the skirt portion to the cap anchor at the top surface of the circuit board.

9. The module of claim 6 wherein the cap anchor substantially surrounds the region; of the circuit board supporting the circuit components.

10. The module of claim 1 wherein the stack of conductive portions forming the cap anchor forms a plurality of spaced cap anchor posts substantially surrounding the region of the circuit board supporting the circuit components and the conductive paths each comprise an extension of a selected circuit path of the circuit board extending between adjacent cap anchor posts to a location in the circuit board outside the region enclosed by the cap and a second conductive via connected between the extension of the circuit path and the top surface of the circuit board outside the region enclosed by the cap.

11. The module of claim 10 wherein the skirt portion is soldered to the cap anchor at the top surface of the circuit board.

12. The module of claim 10 wherein the cap anchor substantially surrounds the region of the circuit board supporting the circuit components.

13. The module of claim 10 wherein a conductive adhesive connects the skirt portion to the cap anchor at the top surface of the circuit board.

14. An electronic module comprising, in combination:
   (a) a substrate;
   (b) a circuit board supported on the substrate, the circuit board having a plurality of circuit paths;
   (c) a plurality of circuit components supported on the circuit board and electrically connected to selected ones of the circuit paths;

(d) a conductive cap anchor through the circuit board between a top surface of the circuit board and the substrate;

(e) a cap having a lid and a skirt portion connected to the cap anchor and hermetically sealed to the top surface of the circuit board to enclose a region of the circuit board in which the circuit components are supported;

(f) a plurality of conductive pads on the top surface of the circuit board outside the region enclosed by the cap; and (g) conductive paths connecting individual conductive pads to selected ones of the circuit paths.

15. The module of claim 14 wherein a conductive adhesive connects the skirt portion to the cap anchor at the top surface of the circuit board.

16. The module of claim 14 wherein the skirt portion is soldered to the cap anchor at the top surface of the circuit board.

17. The module of claim 14 wherein the cap anchor further includes a conductive anchor portion in the substrate.

* * * * *

UNITED STATES PATENT AND TRADEMARK OFFICE
CERTIFICATE OF CORRECTION

PATENT NO. : 5,280,413

DATED : January 18, 1994

INVENTOR(S) : DEEPAK K. PAI

It is certified that error appears in the above-identified patent and that said Letters Patent is hereby corrected as shown below:

Col. 6, line 38, delete "region;", insert --region--

Signed and Sealed this

Twenty-fourth Day of May, 1994

Attest:

BRUCE LEHMAN

Attesting Officer

Commissioner of Patents and Trademarks